US012787669B2

(12) United States Patent
AuBuchon et al.

(10) Patent No.: US 12,787,669 B2
(45) Date of Patent: Nov. 3, 2026

(54) METHODS OF FORMING SILICON NITRIDE FILMS

(71) Applicant: Applied Materials, Inc., Santa Clara, CA (US)

(72) Inventors: Joseph AuBuchon, San Jose, CA (US); Kenneth S. Collins, San Jose, CA (US); Hanhong Chen, Milpitas, CA (US); Philip A. Kraus, San Jose, CA (US); Michael Rice, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 435 days.

(21) Appl. No.: 18/367,136

(22) Filed: Sep. 12, 2023

(65) Prior Publication Data

US 2025/0087477 A1 Mar. 13, 2025

(51) Int. Cl.
*H10P 14/694* (2026.01)
*H10P 14/60* (2026.01)

(52) U.S. Cl.
CPC .... *H10P 14/69433* (2026.01); *H10P 14/6336* (2026.01); *H10P 14/6682* (2026.01)

(58) Field of Classification Search
CPC ....................... H01L 21/0217; H01L 21/0228; C23C 16/345
See application file for complete search history.

(56) References Cited

U.S. PATENT DOCUMENTS

| | | | | |
|---|---|---|---|---|
| 9,796,739 | B2 | 10/2017 | Xiao et al. | |
| 10,354,860 | B2 | 7/2019 | Li et al. | |
| 10,381,219 | B1 | 8/2019 | Ueda et al. | |
| 11,049,694 | B2 | 6/2021 | Aubuchon et al. | |
| 11,139,162 | B2 | 10/2021 | O'Neill et al. | |
| 2009/0087587 | A1 * | 4/2009 | Takahashi | C23C 16/345 427/579 |
| 2011/0236594 | A1 * | 9/2011 | Haverkamp | C23C 16/45512 118/723 R |
| 2012/0122302 | A1 | 5/2012 | Weidman | |

(Continued)

FOREIGN PATENT DOCUMENTS

| | | | |
|---|---|---|---|
| EP | 3553204 | A2 | 10/2019 |
| WO | 2018132568 | A1 | 7/2018 |

OTHER PUBLICATIONS

U.S. Appl. No. 17/991,379, filed Nov. 21, 2022, 56 pages.

(Continued)

*Primary Examiner* — Erik Kielin
(74) *Attorney, Agent, or Firm* — Servilla Whitney LLC

(57) ABSTRACT

Methods of depositing improved quality silicon nitride ($Si_xN_y$) films are disclosed. Exemplary methods include exposing a semiconductor substrate in a semiconductor processing chamber to a silicon-containing precursor, to a first plasma produced from a first gas mixture comprising helium (He) and nitrogen ($N_2$), the first gas mixture comprising a ratio of helium:nitrogen in a range of from 20:1 to 1000:1, and exposing the semiconductor substrate to a second plasma produced from a second gas mixture comprising helium (He), nitrogen ($N_2$), and ammonia ($NH_3$).

20 Claims, 8 Drawing Sheets

(56) References Cited

U.S. PATENT DOCUMENTS

| | | | |
|---|---|---|---|
| 2013/0071580 | A1 | 3/2013 | Weidman |
| 2014/0141625 | A1* | 5/2014 | Fukazawa ......... H01L 21/02167 438/791 |
| 2016/0122869 | A1 | 5/2016 | Lei et al. |
| 2016/0240367 | A1* | 8/2016 | Kimura ............... H10P 14/6339 |
| 2018/0119276 | A1 | 5/2018 | Lei et al. |
| 2018/0315598 | A1 | 11/2018 | Li et al. |
| 2018/0330980 | A1 | 11/2018 | Liang et al. |
| 2019/0006228 | A1 | 1/2019 | Huang et al. |
| 2019/0259598 | A1 | 8/2019 | Chen et al. |
| 2020/0176241 | A1 | 6/2020 | Vats et al. |
| 2021/0090877 | A1* | 3/2021 | Chen ................... H01L 21/0217 |
| 2021/0098236 | A1* | 4/2021 | AuBuchon ........ H01J 37/32256 |
| 2021/0140046 | A1 | 5/2021 | Woods et al. |
| 2022/0028680 | A1 | 1/2022 | Vats et al. |
| 2023/0123038 | A1 | 4/2023 | Aubuchon |
| 2023/0230830 | A1 | 7/2023 | Chen et al. |

OTHER PUBLICATIONS

U.S. Appl. No. 63/525,848, filed Jul. 10, 2023, 68 pages.
PCT International Search Report and Written Opinion in PCT/US2024/045926 dated Dec. 16, 2024, 9 pages.

* cited by examiner

METHODS OF FORMING SILICON NITRIDE FILMS

TECHNICAL FIELD

Embodiments of the disclosure generally relate to the field of semiconductor device manufacturing. More particularly, embodiments of the disclosure are directed to methods of depositing silicon nitride ($Si_xN_y$) films by plasma-enhanced atomic layer deposition (PEALD).

BACKGROUND

The semiconductor processing industry continues to strive for larger production yields while increasing the uniformity of layers deposited on substrates having larger surface areas. As circuit integration increases, the need for greater uniformity and process control regarding layer thickness rises. As a result, various technologies have been developed to deposit layers on substrates in a cost-effective manner, while maintaining control over the characteristics of the layer.

Chemical vapor deposition (CVD) is one of the most common deposition processes employed for depositing layers on a substrate. CVD is a flux-dependent deposition technique that requires precise control of the substrate temperature and the precursors introduced into the processing chamber in order to produce a desired layer of uniform thickness. These requirements become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. In one example, an ALD cycle includes exposing the substrate surface to a first precursor, a purge gas, a second precursor, and the purge gas. The first and second precursors react to form a product compound as a layer (or film) on the substrate surface. The cycle is repeated to form the film to a desired thickness.

Silicon nitride ($Si_xN_y$) films have attractive material and conductive properties. These films have been proposed and tested for applications from front-end of line (FEOL) to back-end of line (BEOL) processes and parts of semiconductor and microelectronic devices. Generally, FEOL refers to the first portion of integrated circuit fabrication, including transistor fabrication, middle of line (MOL) connects the transistor and interconnect parts of a chip using a series of contact structures, and back-end of line (BEOL) refers to a series of process steps after transistor fabrication through completion of a wafer.

Low temperature, e.g., less than or equal to 600° C., ALD of silicon nitride ($Si_xN_y$) films are used in many semiconductor applications. Without intending to be bound by any particular theory, it is thought that many of these lower temperature applications are deposited by plasma-enhanced ALD (PEALD) due to poor film quality by low temperature thermal processes, e.g., a thermal ALD process.

PEALD film quality varies based on the surface (e.g., substrate) on which the film is deposited. In particular, it has been found that PEALD film quality varies based on the geometry of the substrate, and areas that are harder to treat with plasma species may receive less plasma treatment and have poorer film quality.

It would be desirable to deliver a higher flux of the reactive species in the plasma to these difficult-to-reach areas on substrates and provide improved film quality for a given throughput. In particular, it would be desirable to deliver a higher flux of atomic nitrogen by the plasma to the substrate to improve $Si_xN_y$ film quality.

Accordingly, there is a need for methods of delivering a higher flux of reactive species, such as atomic nitrogen, to a substrate to improve $Si_xN_y$ film quality in a PEALD process.

SUMMARY

One or more embodiments of the disclosure are directed to a method of depositing a silicon nitride ($Si_xN_y$) film. The method comprises exposing a semiconductor substrate in a semiconductor processing chamber to a silicon-containing precursor; exposing the semiconductor substrate to a first plasma produced from a first gas mixture comprising helium (He) and nitrogen ($N_2$), the first gas mixture comprising a ratio of helium:nitrogen in a range of from 20:1 to 1000:1; and exposing the semiconductor substrate to a second plasma produced from a second gas mixture comprising helium (He), nitrogen ($N_2$), and ammonia ($NH_3$).

Additional embodiments of the disclosure are directed to a method of depositing a silicon nitride ($Si_xN_y$) film. The method comprises exposing a semiconductor substrate in a semiconductor processing chamber to a silicon-containing precursor; exposing the semiconductor substrate to a first plasma produced from a first gas mixture comprising helium (He) and nitrogen ($N_2$), the first gas mixture comprising a ratio of helium:nitrogen in a range of from 20:1 to 1000:1; exposing the semiconductor substrate to a second plasma produced from a second gas mixture comprising helium (He), nitrogen ($N_2$), and ammonia ($NH_3$); and exposing the semiconductor substrate to the first plasma.

Further embodiments of the disclosure are directed to a method of depositing a silicon nitride ($Si_xN_y$) film. The method comprises exposing a semiconductor substrate in a semiconductor processing chamber to a silicon-containing precursor; exposing the semiconductor substrate to a second plasma produced from a second gas mixture comprising helium (He), nitrogen ($N_2$), and ammonia ($NH_3$); and exposing the semiconductor substrate to a first plasma produced from a first gas mixture comprising helium (He) and nitrogen ($N_2$), the first gas mixture comprising a ratio of helium: nitrogen in a range of from 20:1 to 1000:1.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of the present disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
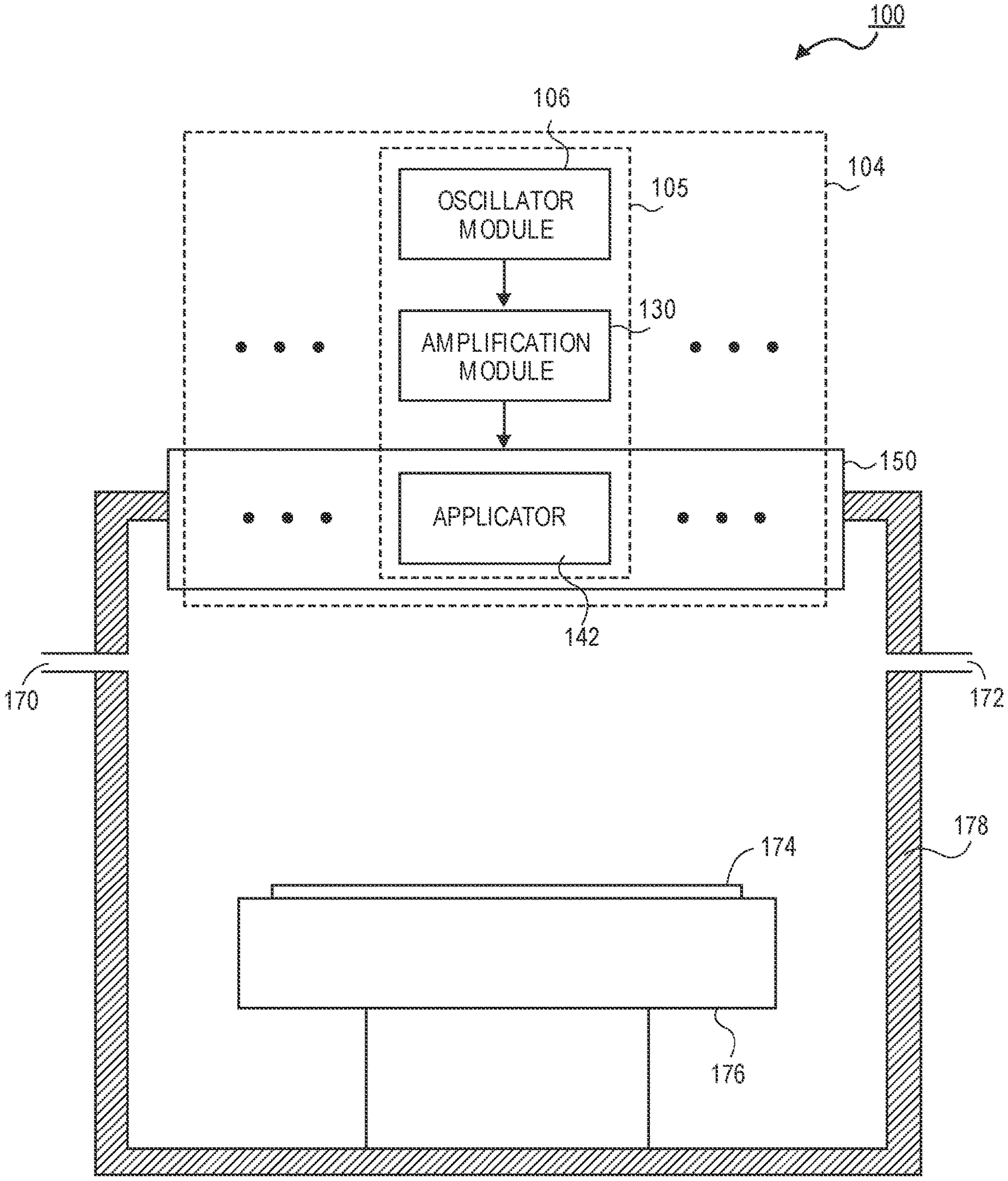
FIG. 1 illustrates a schematic representation of a processing tool comprising a modular high-frequency emission source with a source array that comprises a plurality of applicators according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of "about."

Spatially relative terms, such as "beneath," "below," "lower," "above," "upper" and the like, may be used herein for ease of description to describe one element or feature's relationship to another element(s) or feature(s) as illustrated in the Figures. It will be understood that the spatially relative terms are intended to encompass different orientations of a device in use or operation in addition to the orientation depicted in the figures. For example, if the device in the Figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as a metallic material, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The substrate surface may have one or more features formed therein, one or more layers formed thereon, and combinations thereof. The shape of the feature can be any suitable shape including, but not limited to, trenches, holes and vias (circular or polygonal). As used in this regard, the term "feature" refers to any intentional surface irregularity. Suitable examples of features include but are not limited to trenches, which have a top, two sidewalls and a bottom extending into the substrate, vias which have one or more sidewall extending into the substrate to a bottom, and slot vias. The features described herein can have any suitable aspect ratio (ratio of the depth of the feature to the width of the feature). In one or more embodiments, the aspect ratio of the features described herein is greater than or equal to about 1:1, 2:1, 5:1, 10:1, 15:1, 20:1, 25:1, 30:1, 35:1, or 40:1.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., hydrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. As used herein, the term "thermal process(es)" refers to a deposition technique that does not involve the use of plasma. As used herein, the term "plasma" refers to a composition have ionically charged species and uncharged neutral and radical species.

One or more of the layers deposited on the substrate or substrate surface are continuous. As used herein, the term "continuous" refers to a layer that covers an entire exposed surface without gaps or bare spots that reveal material underlying the deposited layer. A continuous layer may have gaps or bare spots with a surface area less than about 15% or less than about 10% of the total surface area of the layer.

One or more layers deposited on the substrate or substrate surface by atomic layer deposition (ALD) or plasma-enhanced atomic layer deposition (PEALD) are conformal. As used herein, as will be understood by the skilled artisan, a layer which is "conformal" or "conformally deposited" refers to a layer where the thickness is about the same throughout. A layer/film which is conformal varies in thickness by less than or equal to about 5%, 2%, 1% or 0.5%.

Plasma-enhanced atomic layer deposition (PEALD) methods add a plasma exposure to traditional ALD methods. In some PEALD methods, a nitrogen source is provided as the plasma. The primary benefit of PEALD methods is the relatively low substrate temperature, e.g., less than or equal to 600° C., during processing. PEALD may also utilize a single plasma exposure to perform both a precursor-nitrogen reaction step and a film treatment or densification step.

Embodiments of the disclosure are directed to methods of depositing silicon nitride ($Si_xN_y$) films by plasma-enhanced atomic layer deposition (PEALD). The skilled artisan will recognize that the use of a molecular formula such as $Si_xN_y$ does not imply specific stoichiometric relation between the elements but merely the identity of the major components of the film. In some embodiments, the major composition of the specified film (i.e., the sum of the atomic percent of the specified atoms) is greater than or equal to about 95%, 98%, 99%, 99.5%, or 99.9% of the film, on an atomic basis. In one or more embodiments, the silicon nitride ($Si_xN_y$) film comprises $Si_3N_4$.

Embodiments of the disclosure advantageously provides methods of depositing a silicon nitride ($Si_xN_y$) film having improved film quality. Some embodiments advantageously provide methods of depositing improved quality silicon nitride ($Si_xN_y$) films that are useful for FEOL and BEOL processes and parts.

The ability to deliver a higher flux of the reactive species in the plasma to difficult-to-reach areas within substrates results in improved film quality for a given throughput. Atomic nitrogen is one of the reactive species needed to be delivered by the plasma to the substrate to improve $Si_xN_y$ film quality. Embodiments of the present disclosure advantageously provide a higher flux of reactive species, such as atomic nitrogen, to a substrate to improve $Si_xN_y$ film quality in a PEALD process.

There are multiple metrics used to measure $Si_xN_y$ film quality. One of the most common metrics used to measure $Si_xN_y$ film quality is the wet etch rate of the deposited film under dilute hydrofluoric (HF) acid etch solution, such as dilute HF 100:1. Embodiments of the disclosure advantageously provide a $Si_xN_y$ film that has significantly less sidewall loss when using dilute HF 100:1, which represents an improved wet etch rate, compared to a gas mixture of argon (Ar) and nitrogen ($N_2$), for example.

Additional embodiments of the disclosure provide an assembly for a processing tool. In one or more embodiments, the assembly comprises a source array and a housing.

In an embodiment, the source array comprises a dielectric plate, a plurality of cavities extending into the dielectric plate, and a plurality of dielectric resonators in each of the cavities. In one or more embodiments, a width of the dielectric resonator is smaller than a width of the cavity so that a gap separates a sidewall of the dielectric resonator from a sidewall of the cavity. In one or more embodiments, the housing comprises a conductive body, and an opening through the conductive body. The dielectric resonator may be within the opening. In one or more embodiments, the housing further comprises a conductive ring in the gap separating the sidewall of the dielectric resonator from the sidewall of the cavity.

The assembly described herein is a microwave plasma source that may be used to generate a microwave plasma of the gas mixtures. Advantageously, the energy of the microwaves can be tuned low enough that it does not substantially damage dielectric materials (e.g., no plasma and/or low temperature). Further, the disclosed methods are self-limiting by only affecting the $Si_xN_y$ film and not the other layers, such as a dielectric layer, in the structures.

The embodiments of the disclosure are described by way of the Figures, which illustrate processes, substrates, and apparatuses in accordance with one or more embodiments of the disclosure. The processes and resulting substrates shown are merely illustrative of the disclosed processes, and the skilled artisan will recognize that the disclosed processes are not limited to the illustrated applications.

In the following description, numerous specific details are set forth in order to provide a thorough understanding of the embodiments of the disclosure. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

FIG. 1 illustrates a schematic representation of a processing tool 100. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning.

The processing tool 100 includes a semiconductor processing chamber 178. In one or more embodiments, the semiconductor processing chamber 178 is a vacuum chamber. A vacuum chamber may include a pump (not shown) for removing gases from the chamber to provide the desired vacuum. Additional embodiments may include a semiconductor processing chamber 178 that includes one or more gas lines 170 for providing processing gasses into the semiconductor processing chamber 178 and exhaust lines 172 for removing byproducts from the semiconductor processing chamber 178. While not shown, it is to be appreciated that gas may also be injected into the semiconductor processing chamber 178 through a source array 150 (e.g., as a showerhead) for evenly distributing the processing gases over a substrate 174.

In one or more embodiments, the substrate 174 is supported on a chuck 176. For example, the chuck 176 may be any suitable chuck, such as an electrostatic chuck. The chuck 176 may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

In one or more embodiments, the processing tool 100 includes a modular high-frequency emission source 104. The modular high-frequency emission source 104 includes an array of high-frequency emission modules 105. In one or more embodiments, each high-frequency emission module 105 independently includes an oscillator module 106, an amplification module 130, and an applicator 142. As shown, the applicators 142 are schematically shown as being integrated into the source array 150. The skilled artisan will appreciate that the disclosure is not limited to the applicators 142 being integrated into the source array 150.

In one or more embodiments, the oscillator module 106 and the amplification module 130 may comprise electrical components that are solid state electrical components. In one or more embodiments, each of the plurality of oscillator modules 106 are independently communicatively coupled to different amplification modules 130. In some embodiments there may be a 1:1 ratio between oscillator modules 106 and amplification modules 130. For example, each oscillator module 106 may be electrically coupled to a single amplification module 130.

In one or more embodiments, each oscillator module 106 independently generates high-frequency electromagnetic radiation that is transmitted to the amplification module 130. After processing by the amplification module 130, the electromagnetic radiation is transmitted to the applicator 142. In one or more embodiments, the applicators 142 each emit electromagnetic radiation into the semiconductor processing chamber 178.

Figure 2:
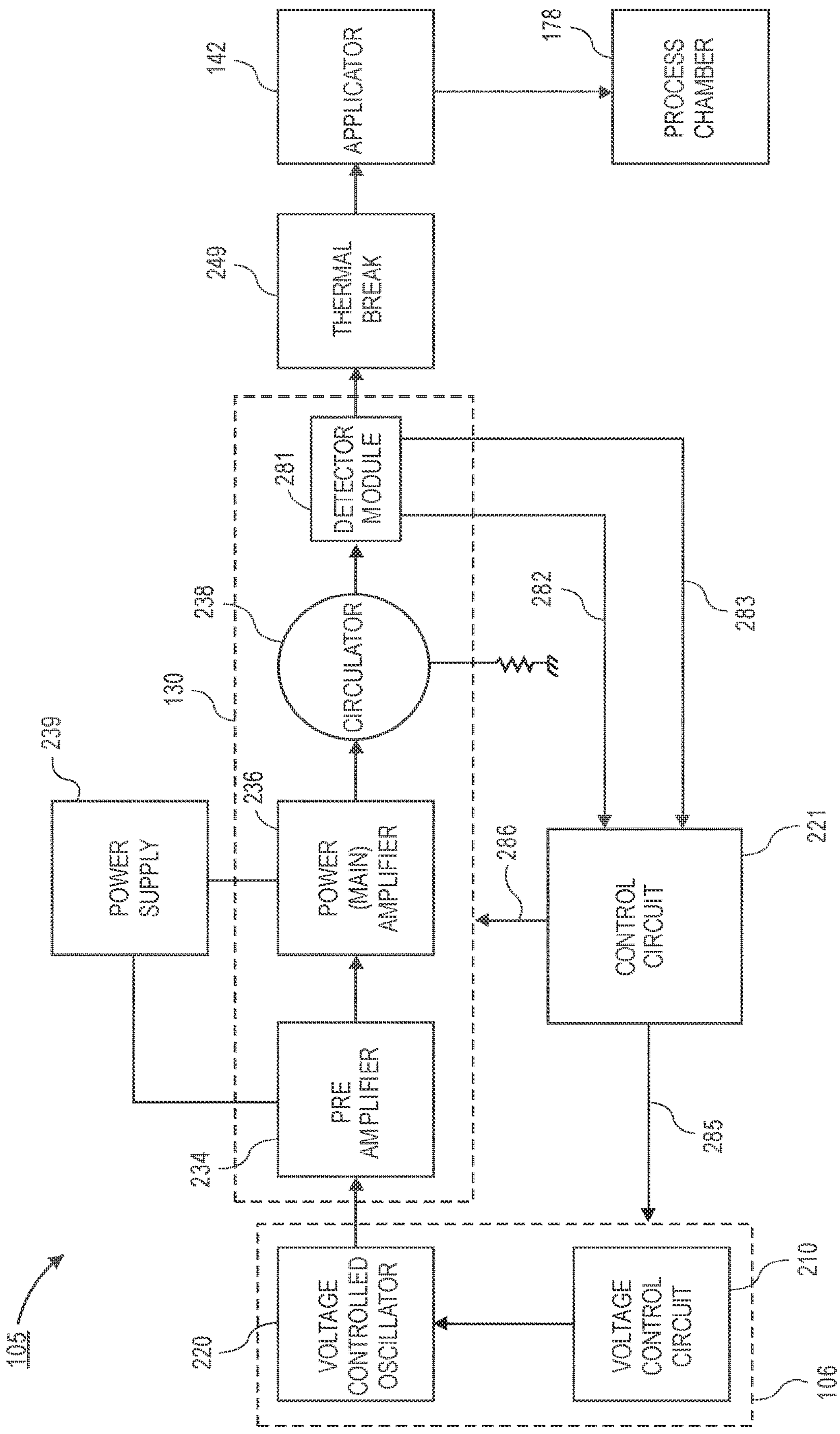
FIG. 2 illustrates a block diagram of a modular high-frequency emission module according to one or more embodiments of the disclosure.

FIG. 2 illustrates a block diagram of a high-frequency emission module 105. In one or more embodiments, the high-frequency emission module 105 comprises an oscillator module 106. The oscillator module 106 may include a voltage control circuit 210 for providing an input voltage to a voltage controlled oscillator 220 in order to produce high-frequency electromagnetic radiation at a desired frequency. One or more embodiments include an input voltage in a range of from 1 V to 10V of DC. In one or more embodiments, the voltage controlled oscillator 220 is an electronic oscillator whose oscillation frequency is controlled by the input voltage. According to one or more embodiments, the input voltage from the voltage control circuit 210 results in the voltage controlled oscillator 220 oscillating at a desired frequency. In some embodiments, the high-frequency electromagnetic radiation has a frequency in a range of from about 0.1 MHz to about 30 MHz. In some embodiments, the high-frequency electromagnetic radiation has a frequency in a range of from about 30 MHz to about 300 MHz. In some embodiments, the high-frequency electro-magnetic radiation has a frequency in a range of from about 300 MHz to about 1 GHz. In some embodiments, the high-frequency electromagnetic radiation has a frequency in a range of from about 1 GHz to about 300 GHz.

According to one or more embodiments, the electromagnetic radiation is transmitted from the voltage controlled oscillator 220 to an amplification module 130. The amplification module 130 may include a driver/pre-amplifier 234, and a main power amplifier 236 that are each coupled to a power supply 239. According to one or more embodiments, the amplification module 130 may operate in a pulse mode. For example, the amplification module 130 may have a duty cycle in a range of from 1% to 99%. In specific embodiments, the amplification module 130 may have a duty cycle in a range of from 15% to 50%.

In some embodiments, the electromagnetic radiation may be transmitted to the thermal break 249 and the applicator 142 after being processed by the amplification module 130. However, part of the power transmitted to the thermal break 249 may be reflected back due to the mismatch in the output impedance. Accordingly, some embodiments include a detector module 281 that allows for the level of forward power 283 and reflected power 282 to be sensed and fed back to the control circuit module 221. The skilled artisan will appreciate that the detector module 281 may be located at one or more different locations in the system (e.g., between the circulator 238 and the thermal break 249). In some embodiments, the control circuit module 221 interprets the forward power 283 and the reflected power 282, and determines the level for the control signal 285 that is communicatively coupled to the oscillator module 106 and the level for the control signal 286 that is communicatively coupled to the amplification module 130. In some embodiments, control signal 285 adjusts the oscillator module 106 to optimize the high-frequency radiation coupled to the amplification module 130. In some embodiments, control signal 286 adjusts the amplification module 130 to optimize the output power coupled to the applicator 142 through the thermal break 249.

Accordingly, one or more embodiments allow for an increased percentage of the forward power to be coupled into the semiconductor processing chamber 178, and increases the available power. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 3:
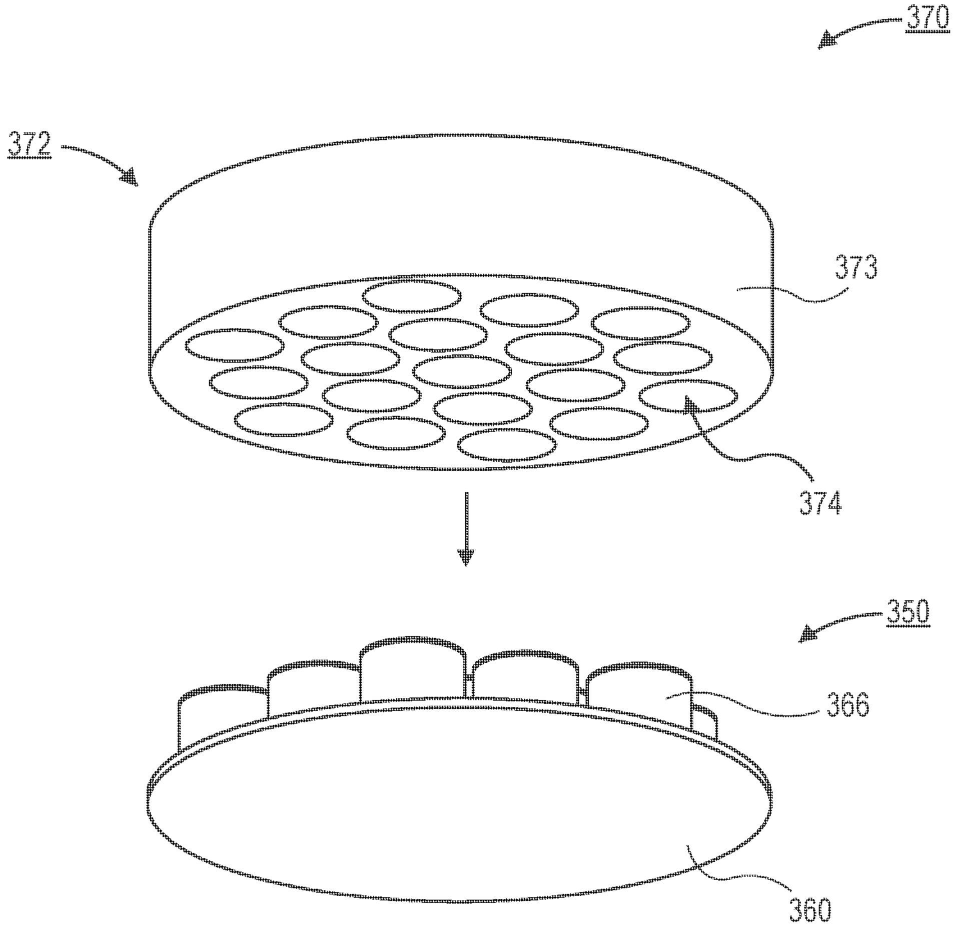
FIG. 3 illustrates a schematic exploded perspective view of an assembly according to one or more embodiments of the disclosure.

Referring now to FIG. 3, a schematic exploded perspective view of an assembly 370 is shown. The assembly 370 comprises a source array 350 and a housing 372. As indicated by the arrows, the housing 372 fits over and around the source array 350. In the illustrated embodiment, the assembly 370 is shown as having a substantially circular shape. However, the skilled artisan will appreciate that the assembly 370 may have any suitable shape such as polygonal, elliptical, wedge shaped, or the like. In some embodiments, the source array 350 comprises a dielectric plate 360 and a plurality of dielectric resonators 366 on the dielectric plate 360. In some embodiments, the dielectric plate 360 and the plurality of dielectric resonators 366 are a monolithic structure. That is, in embodiments where the dielectric plate 360 and the plurality of dielectric resonators 366 are a monolithic structure, there is no physical interface between a bottom of the dielectric resonators 366 and the dielectric plate 360. As used herein, a "physical interface" refers to a first surface of a first discrete body contacting a second surface of a second discrete body.

In other embodiments, the dielectric plate 360 and the dielectric resonators 366 are discrete components. Each of the dielectric resonators 366 are a portion of the applicator 142 used to inject high-frequency electromagnetic radiation into a processing chamber, such as the semiconductor processing chamber 178.

In some embodiments, the source array 350 comprises a dielectric material. For example, the source array 350 may be a ceramic material. In some embodiments, one suitable ceramic material that may be used for the source array 350, as an example, is aluminum oxide ($Al_2O_3$). In specific embodiments where the dielectric plate 360 and the plurality of dielectric resonators 366 are a monolithic structure, the monolithic structure may be fabricated from a single block of material. In other embodiments, a rough shape of the source array 350 may be formed with a molding process, and subsequently machined to provide the final structure with the desired dimensions. For example, green state machining and firing may be used to provide the desired shape of the source array 350. In the illustrated embodiment, the dielectric resonators 366 are shown as having a circular cross-section (when viewed along a plane parallel to the dielectric plate 360). However, the skilled artisan will appreciate that the dielectric resonators 366 may comprise many different cross-sections. For example, the cross-section of the dielectric resonators 366 may have any shape that is centrally symmetric.

In one or more embodiments, the housing 372 comprises a conductive body 373. The conductive body may include any suitable conductive material. For example, the conductive body 373 may be aluminum or the like. The housing comprises a plurality of openings 374. The openings 374 may pass entirely through a thickness of the conductive body 373. The openings 374 may be sized to receive the dielectric resonators 366. For example, as the housing 372 is displaced towards the source array 350 (as indicated by the arrow) the dielectric resonators 366 will be inserted into the openings 374.

In the illustrated embodiment of FIG. 3, the housing 372 is shown as a single conductive body 373. However, the skilled artisan will appreciate that the housing 372 may comprise one or more discrete conductive components. The discrete components may be individually grounded, or the discrete components may be joined mechanically or by any form of metallic bonding, to form a single electrically conductive body 373.

Figure 4:
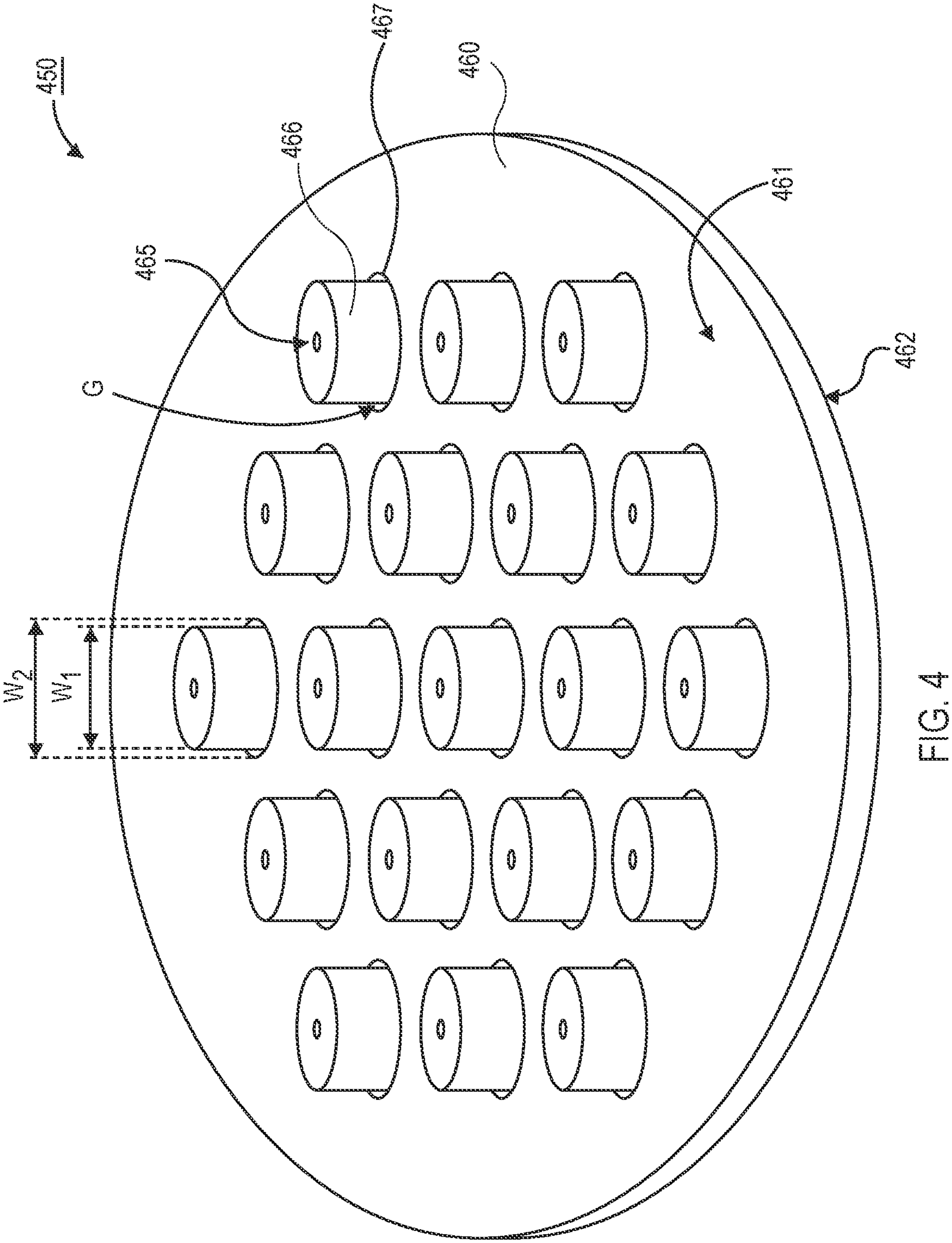
FIG. 4 illustrates a schematic perspective view of a source array with dielectric resonators in cavities in a dielectric plate according to one or more embodiments.

FIG. 4 illustrates a schematic perspective view of a source array 450. In one or more embodiments, the source array 450 comprises the same components and features as the source array 350 shown in FIG. 3. Accordingly, unless provided otherwise, the source array 350 and source array 450 may be described interchangeably. In one or more embodiments, the source array 150 form FIG. 1 includes the same components and features as the source array 350 and source array 450.

In FIG. 4, the source array 450 comprises a dielectric plate 460. A plurality of cavities 467 are disposed into a first surface 461 (e.g., a top surface) of the dielectric plate 460. The cavities 467 do not pass through to a second surface 462 (e.g., a bottom surface) of the dielectric plate 460. Stated differently, the cavities 467 do not pass through a thickness of the dielectric plate 460. The source array 450 may further include a plurality of dielectric resonators 466. Each of the dielectric resonators 466 may be in a different one of the cavities 467.

In embodiments where the dielectric plate 460 and the plurality of dielectric resonators 466 are a monolithic structure, the bottom of the cavity 467 is entirely outside a perimeter defined by the sidewalls of the dielectric resonators 466. In some embodiments, the cavity 467 may be referred to as a groove into the first surface 461 that surrounds the dielectric resonator 466.

The monolithic configuration results in the cavity 467 being a ring shape. Part of the cavity 467 is defined by the sidewall of the dielectric resonator 466. More particularly, an interior surface of the ring cavity 467 is defined by the sidewall of the dielectric resonator 466 and an outer surface of the ring cavity 467 is defined by a portion of the dielectric plate 460.

In some embodiments, each of the dielectric resonators 466 independently comprises a hole 465 in the axial center of the dielectric resonator 466. In one or more embodiments, the hole 465 is sized to accommodate a monopole antenna (not shown). In one or more unillustrated embodiments, the hole 465 extends down into the body of the dielectric resonator 466. In some embodiments, a bottom of the hole 465 is below (in the Z-direction) the first surface 461 of the dielectric plate 460. Stated differently, in embodiments where the bottom of the hole 465 is below (in the Z-direction) the first surface 461 of the dielectric plate 460, the bottom of the hole 465 is within the cavity 467. In some embodiments, a bottom of the hole 465 is at or above (in the Z-direction) the first surface 461 of the dielectric plate 460.

In one or more embodiments, the dielectric resonators 466 may have a first width $W_1$ and the cavities 467 may have a second width $W_2$. In some embodiments, the first width $W_1$ of the dielectric resonators 466 is smaller than the second width $W_2$ of the cavities 467. The difference in the widths provides a gap G between a sidewall of the dielectric resonators 466 and a sidewall of the cavities 467. In the illustrated embodiment of FIG. 4, each of the dielectric resonators 466 are shown as having a uniform width $W_1$. However, the skilled artisan will appreciate that not all dielectric resonators 466 of the source array 450 need to have the same dimensions.

In one or more unillustrated embodiments, the source array 450 includes a conductive layer disposed over the surfaces of the source array 450.

In one or more unillustrated embodiments, the source array 350, 450 includes one or more rings configured to separate the sidewall of the opening 374 in the housing 372 from the sidewall of the dielectric resonator 466. In such embodiments, the rings fill the gap G between the sidewall of the dielectric resonator 466 and the sidewall of the cavity 467 into the dielectric plate 460. That is, a portion of the ring extends below (in the Z-direction) the first surface 461 of the dielectric plate 460. The rings may be electrically coupled to the conductive body 373 and are grounded during operation of the processing tool. Accordingly, the entire length of the sidewall is covered by a grounded surface. It has been advantageously found that covering the entire length of the sidewall with a grounded surface improves the resonance characteristics of the source array 350, and provides improved coupling of the high-frequency electromagnetic radiation into the processing chamber, such as semiconductor processing chamber 178.

Figure 5:
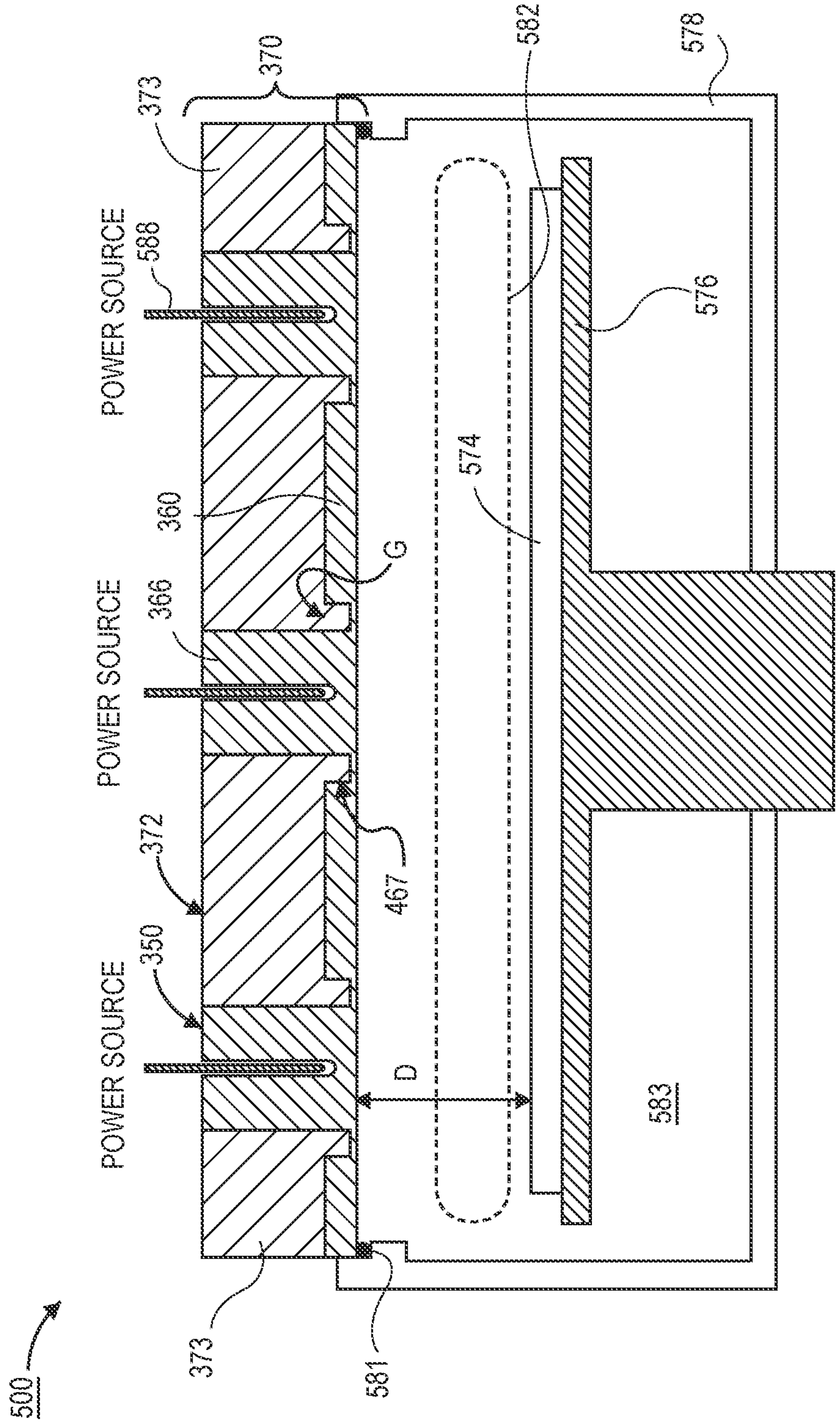
FIG. 5 illustrates a cross-sectional view of a processing tool according to one or more embodiments.

FIG. 5 illustrates a cross-sectional view of a processing tool 500 according to one or more embodiments. In one or more embodiments, the processing tool 500 comprises a semiconductor processing chamber 578 that is sealed by an assembly 370. For example, the assembly 370 may rest against one or more o-rings 581 to provide a vacuum seal to an interior volume 583 of the semiconductor processing chamber 578. In other embodiments, the assembly 370 may interface with the semiconductor processing chamber 578. That is, the assembly 370 may be part of a lid that seals the semiconductor processing chamber 578. In some embodiments, the processing tool 500 may comprise a plurality of processing volumes (which may be fluidically coupled together), with each processing volume having a different assembly 370.

In some embodiments, a chuck 576 or the like may support a workpiece 574 (e.g., wafer, substrate, etc.). In one or more embodiments, the assembly 370 is spaced a distance D from the workpiece 574. The distance D may be any suitable distance. In some embodiments, the chamber interior volume 583 may be suitable for striking a plasma 582. That is, the semiconductor processing chamber 578 may be a vacuum chamber.

In one or more embodiments, the assembly 370 comprises the source array 350 and the housing 372. As stated elsewhere herein, unless provided otherwise, the source array 350 and source array 450 may be described interchangeably.

In some embodiments, monopole antennas 588 may extend into holes 365 in the dielectric resonators 366. The monopole antennas 588 are each electrically coupled to power sources (e.g., high-frequency emission modules 105).

Methods of depositing a silicon nitride ($Si_xN_y$) film on a semiconductor substrate are described with reference to FIGS. 6A-6D, 7, and 8A-8B. FIGS. 6A-6D illustrate process flow diagrams of methods (10, 20, 30, and 40, respectively) of depositing the $Si_xN_y$ film on a semiconductor substrate 50 shown in FIGS. 7 and 8A-8B. In one or more embodiments, the semiconductor substrate 50 is the substrate 174 in the processing tool 100. In one or more embodiments, the semiconductor substrate 50 is the substrate 574 in the processing tool 500. The methods of depositing the $Si_xN_y$ film described herein may be implemented in any of the processing tools described herein, including, but not limited to, the illustrated and unillustrated embodiments described above with respect to FIGS. 1-5.

Figure 6A:
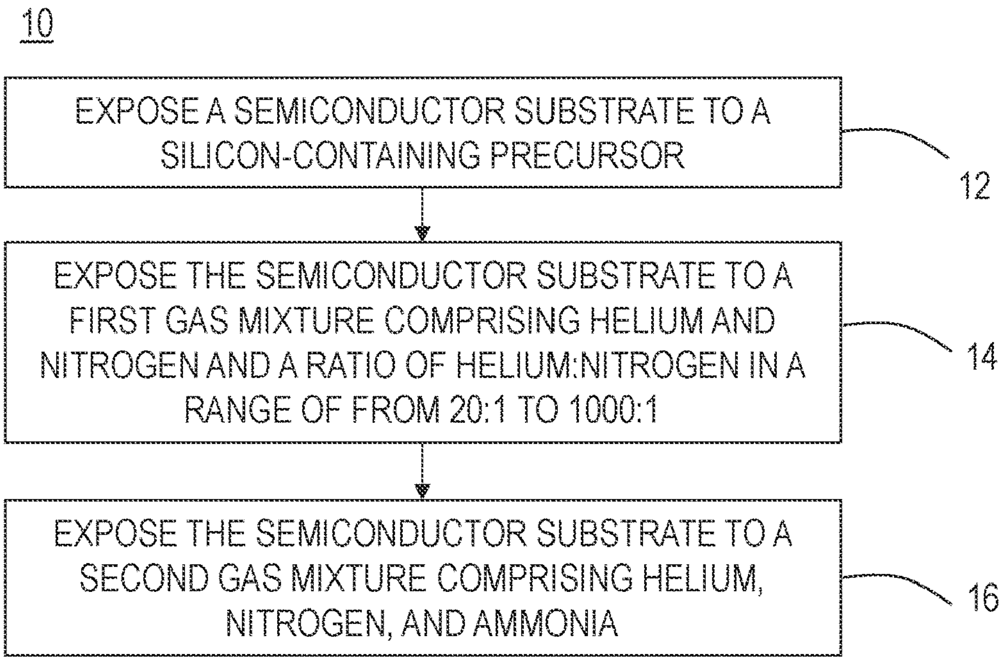
FIG. 6A illustrates a process flow diagram of one method of depositing a silicon nitride ($Si_xN_y$) film according to one or more embodiments of the disclosure.

In FIG. 6A, method 10 comprises exposing a semiconductor substrate in a semiconductor processing chamber to a silicon-containing precursor (operation 12); exposing the semiconductor substrate to a first plasma produced from a first gas mixture comprising helium (He) and nitrogen ($N_2$), the first gas mixture comprising a ratio of helium:nitrogen in a range of from 20:1 to 1000:1 (operation 14); and exposing the semiconductor substrate to a second plasma produced from a second gas mixture comprising helium (He), nitrogen ($N_2$), and ammonia ($NH_3$) (operation 16). One or more of the operations of method 10 may be repeated. In some embodiments, the method 10 consists essentially of operations 12, 14, and 16. In some embodiments, the method 10 consists of operations 12, 14, and 16.

As used herein, "exposing the semiconductor substrate to a first plasma" may be interchangeably referred to as a "first plasma exposure." As used herein, "exposing the semiconductor substrate to a second plasma" may be interchangeably referred to as a "second plasma exposure."

Figure 6B:
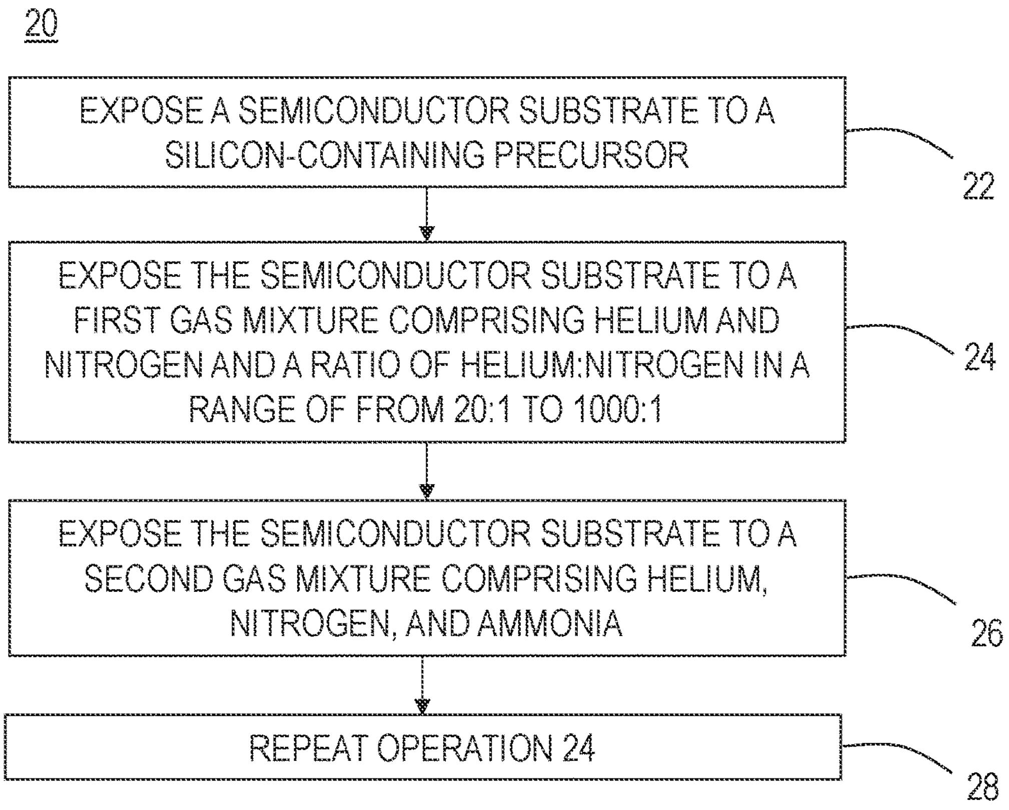
FIG. 6B illustrates a process flow diagram of one method of depositing a silicon nitride ($Si_xN_y$) film according to one or more embodiments of the disclosure.

In FIG. 6B, method 20 comprises exposing a semiconductor substrate in a semiconductor processing chamber to a silicon-containing precursor (operation 22); exposing the semiconductor substrate to a first plasma produced from a first gas mixture comprising helium (He) and nitrogen ($N_2$), the first gas mixture comprising a ratio of helium:nitrogen in a range of from 20:1 to 1000:1 (operation 24); exposing the semiconductor substrate to a second plasma produced from a second gas mixture comprising helium (He), nitrogen ($N_2$), and ammonia ($NH_3$) (operation 26); and repeating operation 24, e.g., exposing the semiconductor substrate to the first plasma (operation 28). In some embodiments, the method 20 consists essentially of operations 22, 24, 26, and 28. In some embodiments, the method 20 consists of operations 22, 24, 26, and 28.

Figure 6C:
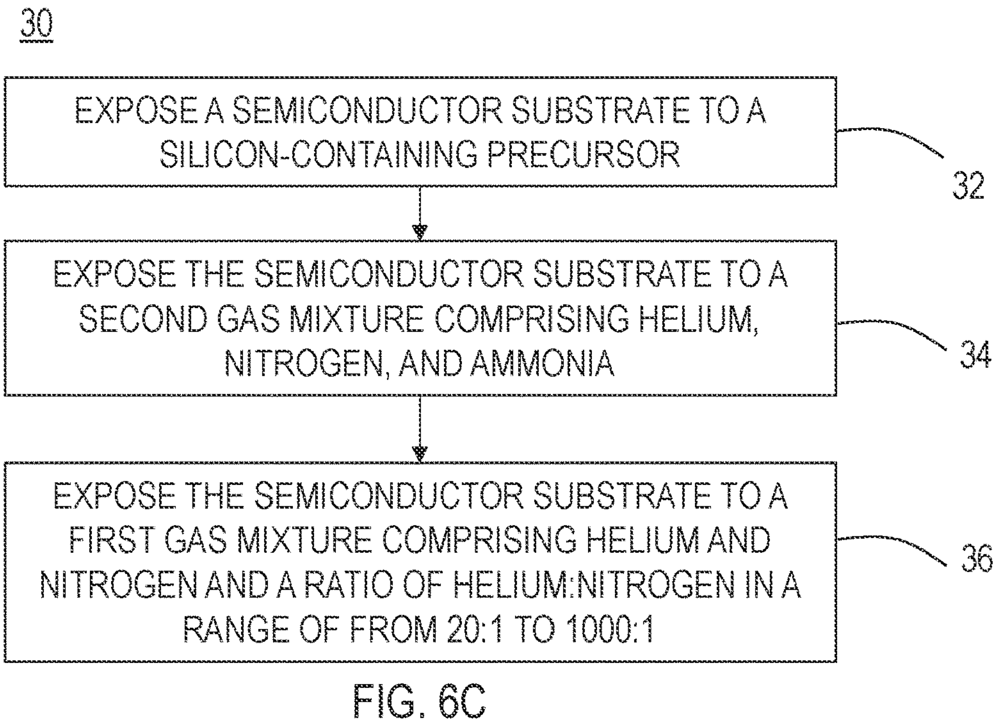
FIG. 6C illustrates a process flow diagram of one method of depositing a silicon nitride ($Si_xN_y$) film according to one or more embodiments of the disclosure.

In FIG. 6C, method 30 comprises exposing a semiconductor substrate in a semiconductor processing chamber to a silicon-containing precursor (operation 32); exposing the semiconductor substrate to a second plasma produced from a second gas mixture comprising helium (He), nitrogen ($N_2$), and ammonia ($NH_3$) (operation 34); and exposing the semiconductor substrate to a first plasma produced from a first gas mixture comprising helium (He) and nitrogen ($N_2$), the first gas mixture comprising a ratio of helium:nitrogen in a range of from 20:1 to 1000:1 (operation 36). One or more of the operations of method 30 may be repeated. In some embodiments, the method 30 consists essentially of operations 32, 34, and 36. In some embodiments, the method 30 consists of operations 32, 34, and 36.

Figure 6D:
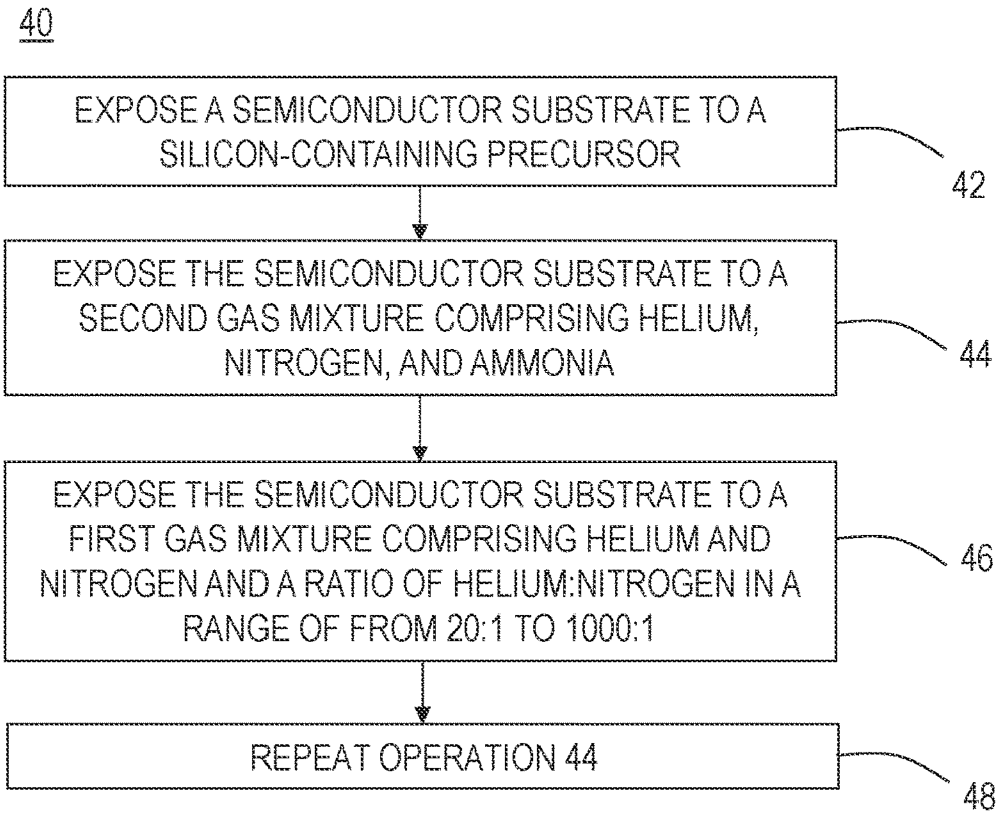
FIG. 6D illustrates a process flow diagram of one method of depositing a silicon nitride ($Si_xN_y$) film according to one or more embodiments of the disclosure.

In FIG. 6D, method 40 comprises exposing a semiconductor substrate in a semiconductor processing chamber to a silicon-containing precursor (operation 42); exposing the semiconductor substrate to a second plasma produced from a second gas mixture comprising helium (He), nitrogen ($N_2$), and ammonia ($NH_3$) (operation 44); exposing the semiconductor substrate to a first plasma produced from a first gas mixture comprising helium (He) and nitrogen ($N_2$), the first gas mixture comprising a ratio of helium:nitrogen in a range of from 20:1 to 1000:1 (operation 46); and repeating operation 44, e.g., exposing the semiconductor substrate to the second plasma. In some embodiments, the method 40 consists essentially of operations 42, 44, 46, and 48. In some embodiments, the method 40 consists of operations 42, 44, 46, and 48.

The use of ordinals such as "first" and "second" to describe the specific gas mixture, e.g., the first gas mixture and the second gas mixture, does not imply an order of formation. A semiconductor substrate may be exposed to a "second" gas mixture before the semiconductor substrate is exposed to a "first" gas mixture. The ordinals are used for descriptive purposes when referring to the Figures.

The ability to deliver a higher flux of the reactive species in the plasma to difficult-to-reach areas within substrates results in improved film quality for a given throughput. It has been advantageously found that that using a gas mixture (e.g., the first gas mixture and/or the second gas mixture) comprising a majority of helium (He) and small amounts of nitrogen ($N_2$) results in improved delivery of reactive species in the plasma to the semiconductor substrate, including semiconductor substrates having at least one feature therein. Advantageously, it was observed that the first gas mixture described herein provided a higher flux of atomic nitrogen than an argon (Ar) plasma due to higher electron temperature and more reaction pathways under the same processing conditions.

The silicon-containing precursor may be any suitable precursor that includes silicon. In some embodiments, the silicon-containing precursor includes, but is not limited to, one or more of a silane ($Si_xH_y$), a chlorosilane ($Si_xH_yCl_z$), or an iodosilane ($Si_xH_yI_z$). In some embodiments, the silicon-containing precursor includes one or more of silane ($SiH_4$), disilane ($Si_2H_6$), chlorosilane ($H_3SiCl$), dichlorosilane ($H_2SiCl_2$), trichlorosilane ($HSiCl_3$), tetrachlorosilane ($SiCl_4$), iodosilane ($H_3ISi$), diiodosilane ($H_2I_2Si$), triiodosilane ($HI_3Si$), or tetraiodosilane ($I_4Si$). In some embodiments, the silicon-containing precursor includes bis(diethylamino) silane (BDEAS).

In one or more embodiments, the first gas mixture comprises helium (He) and nitrogen ($N_2$). In some embodiments, the first gas mixture consists essentially of helium (He) and nitrogen ($N_2$). In some embodiments, the first gas mixture consists of helium (He) and nitrogen ($N_2$).

In one or more embodiments, the first gas mixture includes greater than or equal to 50%, greater than or equal to 80%, greater than or equal to 90%, or greater than or equal to 95% helium (He). In one or more embodiments, the first gas mixture includes in a range of from 0.1% to 5% nitrogen ($N_2$) and in a range of from 95% to 99.9% helium (He). The respective percentages of helium and nitrogen may be expressed as a ratio of helium:nitrogen. In some embodiments, the first gas mixture includes a ratio of helium:nitrogen in a range of from 20:1 to 1000:1. In some embodiments, the ratio of helium:nitrogen is 20:1. In some embodiments, the ratio of helium:nitrogen is 30:1. In some embodiments, the ratio of helium:nitrogen is in a range of from 30:1 to 100:1. In some embodiments, the ratio of helium:nitrogen is 33:1. In some embodiments, the ratio of helium:nitrogen is 50:1. In some embodiments, the ratio of helium:nitrogen is 100:1. In some embodiments, the ratio of helium:nitrogen is 200:1. In some embodiments, the ratio of helium:nitrogen is 300:1. In some embodiments, the ratio of helium:nitrogen is 500:1. In some embodiments, the ratio of helium:nitrogen is 1000:1.

In some embodiments, the second gas mixture comprises helium (He), nitrogen ($N_2$), and ammonia ($NH_3$). In some embodiments, the second gas mixture consists essentially of helium (He), nitrogen ($N_2$), and ammonia ($NH_3$). In some embodiments, the second gas mixture consists of helium (He), nitrogen ($N_2$), and ammonia ($NH_3$). The second gas mixture includes any suitable ratio of helium (He), nitrogen ($N_2$), and ammonia ($NH_3$).

In some embodiments, the second gas mixture has in a range of from about 1% to about 5% nitrogen ($N_2$), in a range of from about 1% to about 20% ammonia ($NH_3$), and in a range of from about 75% to about 98% helium (He). In some embodiments, the second gas mixture has in a range of from 1% to 5% nitrogen ($N_2$), in a range of from 1% to 20% ammonia ($NH_3$), and in a range of from 75% to 98% helium (He). In some embodiments, the second gas mixture has 3% nitrogen ($N_2$), 12% ammonia ($NH_3$), and 85% helium (He).

In one or more embodiments, a remote plasma source, an inductively coupled plasma (ICP) source, a capacitively coupled plasma (CCP) source, or a microwave plasma source may be used to generate the first plasma produced from the first gas mixture and the second plasma produced from the second gas mixture.

The skilled artisan will appreciate that any remote plasma source, inductively coupled plasma (ICP) source, capacitively coupled plasma source (CCP) source, or microwave plasma source that is suitable for generating the first plasma produced from the first gas mixture and the second plasma produced from the second gas mixture may be implemented for the disclosed methods.

One or more embodiments of the present disclosure include modular microwave plasma processing tools. Modular microwave plasma sources have a high plasma density and very low plasma potential (e.g., less than or equal to 10 eV).

In some embodiments, the first plasma produced from the first gas mixture is a microwave plasma generated by a microwave plasma source, including, but not limited to, the microwave plasma sources described herein. In some embodiments, the second plasma produced from the second gas mixture is a microwave plasma generated by a microwave plasma source, including, but not limited to, the microwave plasma sources described herein.

In one or more embodiments, each of the first plasma produced from the first gas mixture and the second plasma produced from the second gas mixture is a microwave plasma generated by the microwave plasma sources described herein.

In some embodiments, the methods 10, 20, 30, 40, are performed at relatively low temperatures. The relative low temperatures advantageously result in decreased damage to surrounding materials (e.g., dielectrics). In some embodiments, the semiconductor processing chamber is maintained at a temperature in the range of 20° C. to 600° C. In some embodiments, the semiconductor processing chamber is maintained at a temperature less than or equal to 500° C. In some embodiments, the semiconductor processing chamber is maintained at a temperature in a range of about 350° C. to about 450° C. In some embodiments, the semiconductor processing chamber is maintained at a temperature in a range of about 300° C. to about 400° C. In some embodiments, the semiconductor processing chamber is maintained at a temperature of less than or equal to about 300° C., less than or equal to about 200° C., or less than or equal to about 100° C. In some embodiments, the semiconductor processing chamber is maintained at temperature in a range of about 20° C. to about 50° C. or in a range of about 20° C. to about 100° C.

In some embodiments, a total delivered power from the microwave source is equal to level of forward power 283 minus the level of reflected power 282. In some embodiments, the total delivered power from microwave source is in a range of about 2300 Watts (W) to about 3800 Watts (W), such as, for example, 3325 Watts (W).

In some embodiments, the pressure of the semiconductor processing chamber may be controlled. In some embodiments, the semiconductor processing chamber is maintained at a pressure in a range of about 0.5 Torr to about 5 Torr.

Figure 7:
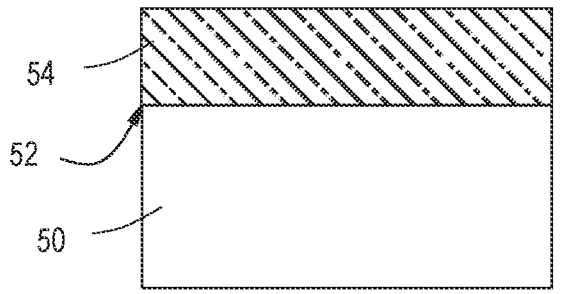
FIG. 7 illustrates a schematic cross-sectional view of a semiconductor substrate according to one or more embodiments of the disclosure.
Figure 8A:
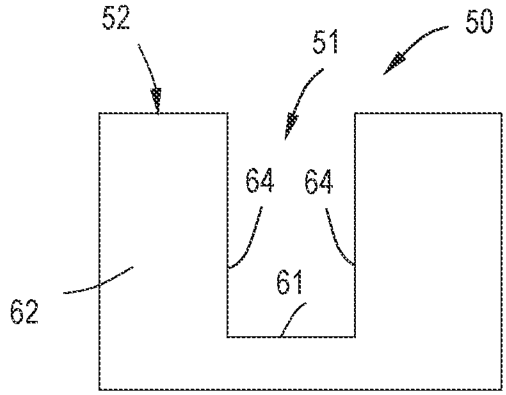
FIG. 8A illustrates a schematic cross-sectional view of a semiconductor substrate according to one or more embodiments of the disclosure.
Figure 8B:
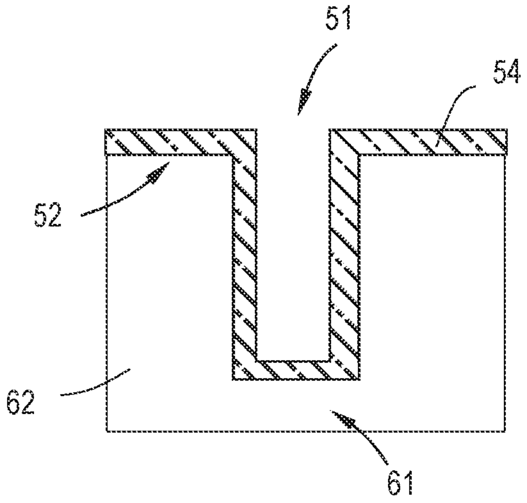
FIG. 8B illustrates a schematic cross-sectional view of a semiconductor substrate according to one or more embodiments of the disclosure.

FIGS. 7 and 8A-8B illustrate schematic cross-sectional views of a semiconductor substrate 50 (or substrate 50) having a silicon nitride ($Si_xN_y$) film 54 thereon. In some embodiments, the $Si_xN_y$ film 54 is the $Si_xN_y$ film that is formed in one or more of method 10, method 20, method 30, or method 40.

The substrate 50 can be any suitable substrate material. In one or more embodiments, the substrate 50 comprises a semiconductor material, e.g., any metal material, silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), a high-K dielectric material other semiconductor materials, or any combination thereof. In one or more embodiments, the substrate 50 comprises one or more of silicon (Si), germanium (Ge), gallium (Ga), arsenic (As), indium (In), phosphorus (P), or selenium (Se). Although a few examples of materials from which the substrate 50 may be made have been provided, any material that may serve as a foundation upon which passive and active electronic devices (e.g., transistors, memories, capacitors, inductors, resistors, switches, integrated circuits, amplifiers, optoelectronic devices, or any other electronic devices) may be utilized.

In some embodiments, the substrate 50 may include dielectric materials, for example, silicon-containing dielectric materials and/or metal oxide dielectric materials. In some embodiments, the substrate 50 may comprise one or more dielectric surfaces comprising a low-K dielectric material such as, but not limited to, silicon oxide (SiOx), silicon sub-oxides, silicon nitride ($Si_xN_y$), silicon nitride ($Si_3N_4$), silicon carbide ($SiC_x$), silicon oxycarbide ($SiO_xC_y$), silicon carbonitride ($SiC_xN_y$), silicon oxynitride ($SiO_xN_y$), tantalum nitride (TaN), hafnium oxide ($HfO_x$), or combinations thereof.

In FIGS. 7 and 8A-8B, the $Si_xN_y$ film 54 is formed on a top surface 52 of the substrate 50. In some embodiments, the $Si_xN_y$ film 54 has a thickness in a range of from about 0.5 nm to about 30 nm. In some embodiments, the $Si_xN_y$ film 54 has a thickness in a range of from about 1 nm to about 8 nm.

Further aspects of the disclosure pertain to a method that is part of a gap fill process. The disclosed methods may be utilized with any device nodes, but may be particularly advantageous in device nodes of about 25 nm or less, for example about 5 nm to about 25 nm. In some embodiments, a $Si_xN_y$ film 54 is deposited on a dielectric surface with one or more high aspect ratio gap features, including vertical gap features and/or horizontal gap features, and the $Si_xN_y$ film 54 in the gap features forms horizontal interconnects through which current flows.

FIGS. 8A-8B illustrate schematic cross-sectional views of a deposition process on the substrate 50 including at least one feature 51 that has a gap defined by a top surface 52, two opposed sidewalls 64 and a bottom surface 61. The two opposed sidewalls 64 may comprise any suitable material. In one or more embodiments, the two opposed sidewalls 64 comprise a dielectric material, e.g., a low-K dielectric material such as, but not limited to, silicon oxide (SiOx), silicon sub-oxides, silicon nitride ($Si_xN_y$), silicon nitride ($Si_3N_4$), silicon carbide ($SiC_x$), silicon oxycarbide ($SiO_xC_y$), silicon carbonitride ($SiC_xN_y$), silicon oxynitride ($SiO_xN_y$), tantalum nitride (TaN), hafnium oxide ($HfO_x$), or combinations thereof. The bottom surface 61 may comprise any suitable material, such as a metallic material.

In FIG. 8A, the substrate 50 is shown having a single feature 51. Referring to FIG. 8B, in one or more embodiments, a conformally deposited $Si_xN_y$ film 54 is shown directly on the top surface 52 and along the two opposed sidewalls 64 and the bottom surface 61.

The Figures show the substrate 50 having a single feature 51 for illustrative purposes; however, those skilled in the art will understand that there can be more than one feature 51. The shape of the feature 51 can be any suitable shape including, but not limited to, trenches and cylindrical vias, as described herein.

In one or more embodiments, the at least one feature 51 comprises one or more of a trench or a via. In specific embodiments, the at least one feature 51 comprises a trench. In still further embodiments, the term "at least one feature 51" and "trench 51" may be used interchangeably. The trench 51 has a depth to the bottom surface 61 and a width between the two opposed sidewalls 64. In some embodiments, the depth is in a range of 2 nm to 200 nm, 3 nm to 200 nm, 5 nm to 100 nm, 2 nm to 100 nm, or 50 nm to 100 nm. In some embodiments, the width is in a range of 10 nm to 100 nm, 10 nm to 20 nm, 10 nm to 50 nm, or 50 nm to 100 nm. In one or more embodiments, the aspect ratio of the trench 51 described herein is greater than or equal to about 1:1, 2:1, 5:1, 10:1, 15:1, 20:1, 25:1, 30:1, 35:1, or 40:1.

The methods described herein may be performed in any suitable processing chamber known to the skilled artisan. The methods described herein may be performed in, for example, a PEALD processing chamber.

Embodiments of the disclosure are directed to processing tools. In some embodiments, the processing tool comprises: a central transfer station comprising a robot configured to move a semiconductor, a plurality of process stations, and a controller connected to the central transfer station and the plurality of process stations. In some embodiments, each process station is connected to the central transfer station and provides a processing region separated from processing regions of adjacent process stations. In some embodiments, the plurality of process stations comprises a plasma-enhanced atomic layer deposition (PEALD) chamber. In some embodiments, the controller is configured to activate the robot to move the wafer between process stations, and to control a processing method, such as method 10, 20, 30, and/or 40 for forming a $Si_xN_y$ film on the semiconductor substrate.

One or more embodiments of the disclosure are directed to a non-transitory computer readable medium including instructions, that, when executed by a controller of a processing chamber, cause the processing chamber to perform the operations of method 10. In some embodiments, the non-transitory computer readable medium includes instructions, that, when executed by a controller of a processing chamber, cause the processing chamber to perform the operations of method 20. In some embodiments, the non-transitory computer readable medium includes instructions, that, when executed by a controller of a processing chamber, cause the processing chamber to perform the operations of method 30. In some embodiments, the non-transitory computer readable medium includes instructions, that, when executed by a controller of a processing chamber, cause the processing chamber to perform the operations of method 40.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Comparative Example 1

A silicon nitride ($Si_xN_y$) film was deposited by PEALD on a semiconductor substrate by sequentially exposing the semiconductor substrate to a silicon-containing precursor, a nitrogen-containing precursor, and a microwave plasma comprising argon (Ar). The semiconductor substrate has at least one feature formed therein. The at least one feature defines a trench having a top surface, a bottom surface, and two opposed sidewalls. The at least one feature has an aspect ratio of 6:1.

An amount of sidewall loss was measured after treating the deposited silicon nitride ($Si_xN_y$) film with dilute hydrofluoric (HF) acid etch solution for 2 minutes. The amount of sidewall loss was about 35 Å.

Comparative Example 2

A silicon nitride ($Si_xN_y$) film was deposited by PEALD on a semiconductor substrate by exposing the semiconductor substrate to a silicon-containing precursor and a capacitively coupled plasma (CCP) at 60 MHz formed of a nitrogen-containing precursor. The semiconductor substrate has at least one feature formed therein. The at least one feature defines a trench having a top surface, a bottom surface, and two opposed sidewalls. The at least one feature has an aspect ratio of 6:1.

An amount of sidewall loss was measured after treating the deposited silicon nitride ($Si_xN_y$) film with dilute hydrofluoric (HF) acid etch solution for 2 minutes. The amount of sidewall loss was about 22 Å.

Inventive Example 1

A silicon nitride ($Si_xN_y$) film was deposited by PEALD on a semiconductor substrate by exposing the semiconductor substrate to a silicon-containing precursor and exposing the semiconductor substrate to a microwave plasma produced from a gas mixture comprising helium (He) and nitrogen ($N_2$), as in the disclosed methods 10, 20, 30, and 40. The first gas mixture comprised a ratio of helium:nitrogen in a range of from 20:1 to 1000:1. The at least one feature defines a trench having a top surface, a bottom surface, and two opposed sidewalls. The at least one feature has an aspect ratio of 6:1.

An amount of sidewall loss was measured after treating the deposited silicon nitride ($Si_xN_y$) film with dilute hydrofluoric (HF) acid etch solution for 2 minutes. The amount of sidewall loss was less than 6 Å.

The same silicon-containing precursor was used in each of the Comparative Examples and the Inventive Example. Advantageously, depositing the silicon nitride ($Si_xN_y$) film by PEALD using the microwave plasma produced from a gas mixture comprising helium (He) and nitrogen ($N_2$) in a ratio of helium:nitrogen in a range of from 20:1 to 1000:1 has significantly less sidewall loss (e.g., improved wet etch rate) and improved film quality as compared to the silicon nitride ($Si_xN_y$) film of Comparative Examples 1 and 2.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a silicon nitride ($Si_xN_y$) film, the method comprising:

exposing a semiconductor substrate in a semiconductor processing chamber to a silicon-containing precursor;

exposing the semiconductor substrate to a first plasma produced from a first gas mixture comprising helium (He) and nitrogen ($N_2$), the first gas mixture comprising a ratio of helium:nitrogen in a range of from 20:1 to 1000:1; and exposing the semiconductor substrate to a second plasma produced from a second gas mixture comprising helium (He), nitrogen ($N_2$), and ammonia ($NH_3$), the second gas mixture having in a range of from 1% to 5% nitrogen ($N_2$), in a range of from 1% to 20% ammonia ($NH_3$), and in a range of from 75% to 98% helium (He), wherein one or more of the first plasma or the second plasma is generated by an inductively coupled plasma (ICP) source or a capacitively coupled plasma (CCP) source.

2. The method of claim 1, wherein the first gas mixture consists of helium (He) and nitrogen ($N_2$).

3. The method of claim 1, further comprising repeating exposing the semiconductor substrate to the first plasma and/or exposing the semiconductor substrate to the second plasma.

4. The method of claim 1, wherein the silicon-containing precursor includes silane ($SiH_4$), disilane ($Si_2H_6$), dichlorosilane ($SiH_2Cl_2$), or bis(diethylamino)silane (BDEAS).

5. The method of claim 1, wherein the ratio of helium: nitrogen in the first gas mixture is in a range of from 33:1 to 100:1 and the second gas mixture has 3% nitrogen ($N_2$), 12% ammonia ($NH_3$), and 85% helium (He).

6. The method of claim 1, wherein the semiconductor processing chamber is maintained at a temperature of less than or equal to 500° C.

7. The method of claim 1, wherein the semiconductor processing chamber is maintained at a pressure in a range of from 0.5 Torr to 5 Torr.

8. The method of claim 1, wherein the semiconductor substrate has at least one feature formed therein, the at least one feature defining a trench having a top surface, a bottom surface, and two opposed sidewalls.

9. A method of depositing a silicon nitride ($Si_xN_y$) film, the method comprising:

exposing a semiconductor substrate in a semiconductor processing chamber to a silicon-containing precursor;

exposing the semiconductor substrate to a first plasma produced from a first gas mixture comprising helium (He) and nitrogen ($N_2$), the first gas mixture comprising a ratio of helium: nitrogen in a range of from 20:1 to 1000:1;

exposing the semiconductor substrate to a second plasma produced from a second gas mixture comprising helium (He), nitrogen ($N_2$), and ammonia ($NH_3$) the second gas mixture having in a range of from 1% to 5% nitrogen ($N_2$), in a range of from 1% to 20% ammonia ($NH_3$), and in a range of from 75% to 98% helium (He); and exposing the semiconductor substrate to the first plasma, wherein one or more of the first plasma or the second plasma is generated by an inductively coupled plasma (ICP) source or a capacitively coupled plasma (CCP) source.

10. The method of claim 9, wherein the first gas mixture consists of helium (He) and nitrogen ($N_2$).

11. The method of claim 9, wherein the second gas mixture has 3% nitrogen ($N_2$), 12% ammonia ($NH_3$), and 85% helium (He).

12. The method of claim 9, wherein the semiconductor processing chamber is maintained at a temperature of less than or equal to 500° C.

13. The method of claim 9, wherein the semiconductor processing chamber is maintained at a pressure in a range of from 0.5 Torr to 5 Torr.

14. The method of claim 9, wherein the semiconductor substrate has at least one feature formed therein, the at least one feature defining a trench having a top surface, a bottom surface, and two opposed sidewalls.

15. A method of depositing a silicon nitride ($Si_xN_y$) film, the method comprising:

exposing a semiconductor substrate in a semiconductor processing chamber to a silicon-containing precursor;

exposing the semiconductor substrate to a second plasma produced from a second gas mixture comprising helium (He), nitrogen ($N_2$), and ammonia ($NH_3$), the second gas mixture having in a range of from 1% to 5% nitrogen ($N_2$), in a range of from 1% to 20% ammonia ($NH_3$), and in a range of from 75% to 98% helium (He); and exposing the semiconductor substrate to a first plasma produced from a first gas mixture comprising helium (He) and nitrogen ($N_2$), the first gas mixture comprising a ratio of helium: nitrogen in a range of from 20:1 to 1000:1, wherein each of the first plasma and the second plasma comprise a microwave plasma generated by a microwave plasma source including a source array and a housing, the source array including a dielectric plate, a plurality of cavities extending into the dielectric plate, and a dielectric resonator in each of the plurality of cavities, and the housing including a conductive body and a plurality of openings, each of the plurality of openings sized to receive a respective dielectric resonator.

16. The method of claim 15, wherein the ratio of helium: nitrogen in the first gas mixture is in a range of from 33:1 to 100:1 and the second gas mixture has 3% nitrogen ($N_2$), 12% ammonia ($NH_3$), and 85% helium (He).

17. The method of claim 15, further comprising repeating exposing the semiconductor substrate to the first plasma and/or exposing the semiconductor substrate to the second plasma.

18. The method of claim 15, wherein a width of each of respective dielectric resonators is smaller than a width of each of the plurality of cavities so that a gap separates a sidewall of each respective dielectric resonator from a sidewall of each of the plurality of cavities.

19. The method of claim 15, wherein the semiconductor processing chamber is maintained at a temperature of less than or equal to 500° C.

20. The method of claim 15, wherein the semiconductor processing chamber is maintained at a pressure in a range of from 0.5 Torr to 5 Torr.

* * * * *